US009693479B2

(12) United States Patent
Cader et al.

(10) Patent No.: US 9,693,479 B2
(45) Date of Patent: Jun. 27, 2017

(54) SUPPORT MEMBER

(71) Applicant: Hewlett-Packard Development Company, L.P., Houston, TX (US)

(72) Inventors: Tahir Cader, Liberty Lake, WA (US); John P Franz, Houston, TX (US); Jon Kolas, Houston, TX (US); David A Moore, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/771,800

(22) PCT Filed: Mar. 14, 2013

(86) PCT No.: PCT/US2013/031260
§ 371 (c)(1),
(2) Date: Aug. 31, 2015

(87) PCT Pub. No.: WO2014/142865
PCT Pub. Date: Sep. 18, 2014

(65) Prior Publication Data
US 2016/0029510 A1   Jan. 28, 2016

(51) Int. Cl.
*H05K 7/20* (2006.01)
*H01L 23/473* (2006.01)

(52) U.S. Cl.
CPC .......... *H05K 7/20* (2013.01); *H05K 7/20272* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ...... 361/676–678, 679.46–679.54, 688–723; 165/80.1–80.5, 104.33, 185; 174/15.1–15.3, 16.1–16.3, 547, 548;
(Continued)

(56) References Cited

U.S. PATENT DOCUMENTS

| 5,941,300 A | 8/1999 | Colling et al. |
| 6,618,246 B2 | 9/2003 | Sullivan et al. |
| 7,318,322 B2 | 1/2008 | Ota et al. |

(Continued)

FOREIGN PATENT DOCUMENTS

| CN | 1485906 | 3/2004 |
| CN | 1521591 | 8/2004 |

(Continued)

OTHER PUBLICATIONS

Data Center Best Practices Guide; PG&E Corp, Oct. 2012, http://www.pge.com/includes/docs/pdfs/mybusiness/energysavingsrebates/incentivesbyindustry/DataCenters_BestPractices.pdf, 24 pps.

(Continued)

*Primary Examiner* — Anthony Haughton
*Assistant Examiner* — Razmeen Gafur
(74) *Attorney, Agent, or Firm* — Hewlett Packard Enterprise Patent Department

(57) ABSTRACT

An apparatus to cool an electronic module is provided herein. The apparatus includes a support member and a retaining member. The support member to receive the cooling module. The support member includes a cooling module alignment member to align the cooling module therein. The retaining member to secure the cooling module.

16 Claims, 7 Drawing Sheets

(58) Field of Classification Search
USPC ... 257/712–722, E23.088; 24/453, 458–459; 454/184; 312/236
See application file for complete search history.

(56) References Cited

U.S. PATENT DOCUMENTS

| | | | |
|---|---|---|---|
| 7,885,070 B2 | 2/2011 | Campbell et al. | |
| 8,107,256 B1 | 1/2012 | Kondrat et al. | |
| 2003/0057546 A1 | 3/2003 | Memory et al. | |
| 2004/0221604 A1 | 11/2004 | Ota et al. | |
| 2005/0174741 A1* | 8/2005 | Sevakivi | H05K 7/1432 361/721 |
| 2005/0259391 A1* | 11/2005 | Garnett | H05K 7/20172 361/679.31 |
| 2006/0082970 A1* | 4/2006 | Walz | H05K 7/20645 361/699 |
| 2007/0019384 A1* | 1/2007 | Berkenbush | H05K 7/2049 361/702 |
| 2007/0183126 A1* | 8/2007 | Tilton | H01L 23/4735 361/699 |
| 2007/0200190 A1* | 8/2007 | Koga | G06F 1/203 257/432 |
| 2008/0062640 A1* | 3/2008 | Anderl | H04B 10/806 361/690 |
| 2008/0123297 A1* | 5/2008 | Tilton | H05K 7/20545 361/700 |
| 2008/0144290 A1* | 6/2008 | Brandt | B60R 16/0239 361/720 |
| 2008/0265406 A1* | 10/2008 | Andry | H01L 23/473 257/713 |
| 2009/0109610 A1* | 4/2009 | Hirai | G06F 1/20 361/679.46 |
| 2009/0146293 A1* | 6/2009 | Olesen | H01L 23/473 257/714 |
| 2009/0168352 A1* | 7/2009 | Lan | H05K 7/20154 361/697 |
| 2009/0279261 A1* | 11/2009 | Seynaeve | B60R 16/0239 361/704 |
| 2010/0039785 A1* | 2/2010 | Ice | G02B 6/4201 361/785 |
| 2010/0073865 A1 | 3/2010 | Hayashi et al. | |
| 2010/0097767 A1* | 4/2010 | Jude | H05K 7/20409 361/709 |
| 2010/0175851 A1* | 7/2010 | Heydari | G06F 1/20 165/80.2 |
| 2010/0309626 A1* | 12/2010 | Xu | G06F 1/20 361/679.54 |
| 2011/0114289 A1* | 5/2011 | Altman | F28F 3/12 165/80.4 |
| 2011/0249399 A1* | 10/2011 | Salles | H05K 7/1412 361/691 |
| 2011/0267776 A1* | 11/2011 | Porreca | H05K 7/20545 361/694 |
| 2012/0020020 A1* | 1/2012 | Julien | G02B 6/43 361/689 |
| 2012/0037339 A1* | 2/2012 | Lipp | F28D 1/05316 165/80.2 |
| 2012/0106070 A1* | 5/2012 | Landon | G06F 1/183 361/679.47 |
| 2012/0188714 A1* | 7/2012 | Von Borck | H01M 2/1061 361/688 |
| 2012/0199311 A1 | 8/2012 | Campbell et al. | |

FOREIGN PATENT DOCUMENTS

| | | |
|---|---|---|
| EP | 0767601 A1 | 4/1997 |
| JP | 2001237581 | 8/2001 |
| JP | 2006215882 | 8/2006 |
| JP | 2010-079404 | 4/2010 |
| JP | 2010-080506 | 4/2010 |
| JP | 2012529759 | 11/2012 |

OTHER PUBLICATIONS

PCT/ISA/KR, International Search Report mailed Dec. 13, 2013, PCT/US2013/031260, 13 pps.
EESR dated Nov. 18, 2016; EP Application No. 13878273.5; pp. 10.

* cited by examiner

SUPPORT MEMBER

BACKGROUND

Electronic devices have temperature requirements. Heat from the use of the electronic devices is controlled using cooling systems. Examples of cooling systems include air and liquid cooling.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Electronic system designs must balance conflicts between power density, spatial layout, temperature requirements, acoustic noise, and other factors. Liquid cooling can be more efficient than air cooling. As the liquid goes through the plumbing connections the risk of leakage of liquid within the electronic device is introduced.

In examples, an apparatus to cool an electronic module is provided. The apparatus includes a support member and a retaining member. The support member to receive the cooling module. The support member includes a cooling module alignment member to align the cooling module therein. The retaining member to secure the cooling module therein.

Figure 1:
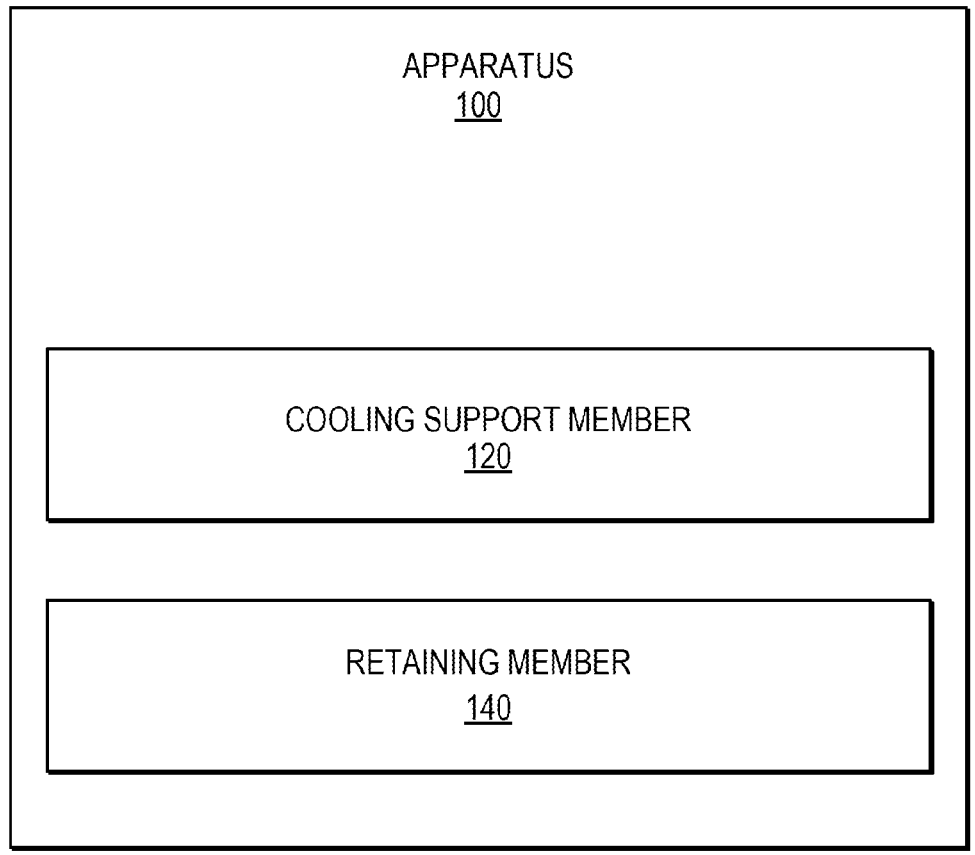
FIG. 1 illustrates a block diagram of an apparatus to cool an electronic module according to an example.

FIG. 1 illustrates a block diagram of an apparatus 100 to cool an electronic module according to an example. The apparatus 100 includes a support member 120 and a retaining member 140. The support member 120 to receive the cooling module. The support member 120 includes a cooling module alignment member to align the cooling module with a cooling module connector at a front portion of the cooling module. The cooling module cools the electronic module by removing heat from the electronic module. A single cooling module may cool at least one electronic module and depending on the configuration may cool a plurality of electronic modules. The retaining member 140 to secure the cooling module therein.

Figure 2:
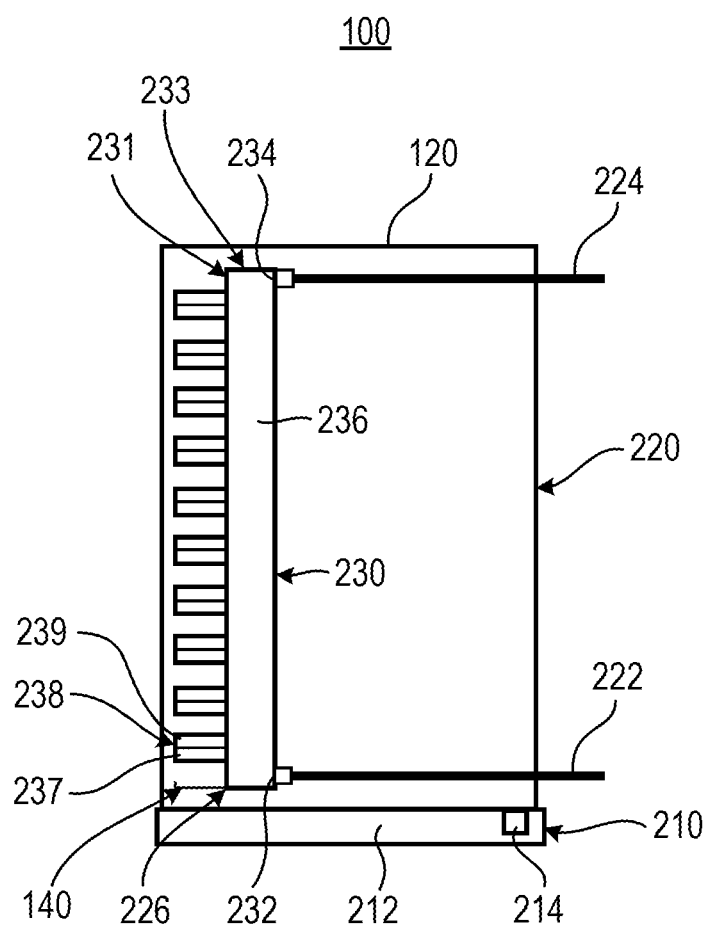
FIG. 2 illustrates a perspective diagram of the apparatus of FIG. 1 according to an example.
Figure 3:
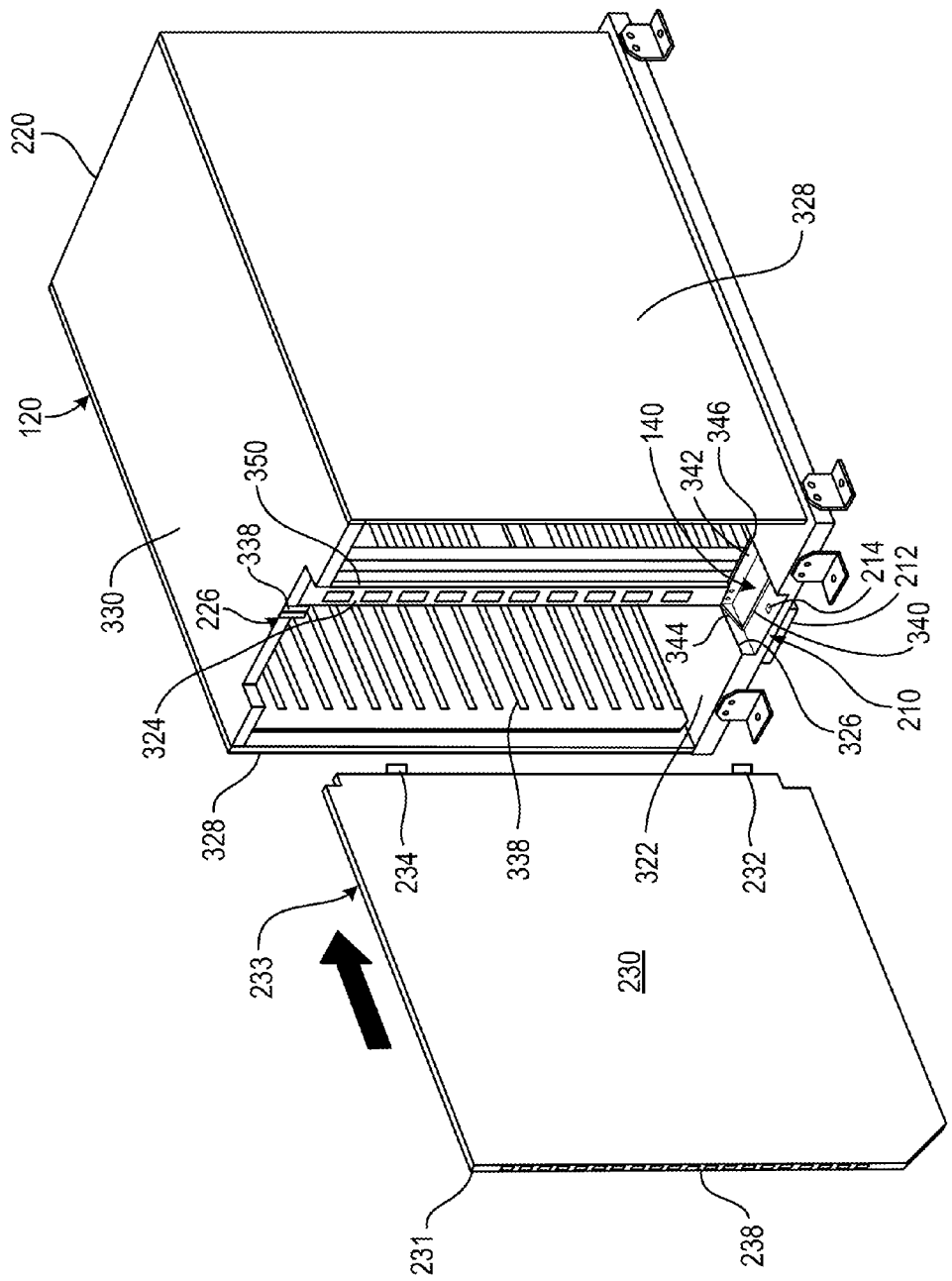
FIG. 3 illustrates a schematic diagram of the apparatus of FIG. 1 according to an example.

FIGS. 2-3 illustrate examples of the apparatus 100 of FIG. 1 with a wet disconnect cooling module according to examples. A wet disconnect cooling module is a module assembly with cooling components that cool an electronic module using a liquid cooling method that transfers fluid between the cooling module and the electronic module using wet or liquid connections that transfer a fluid therethrough. The liquid cooling occurs within the electronic module using the fluid that is transferred to the electronic module to remove heat from electronic components. The heat from the electronic components in the electronic module is transferred to the fluid to cool the electronic components. The fluid, after receiving the heat from the electronic components, is removed from the electronic module with the heat. The fluid may be returned to the cooling module for removal of the heat via a recycling method, or transfer of heat from the cooling module to an external system that may recycle the fluid. For example, the external system may include an outdoor air cooled heat exchanger or a building chilled water loop.

Referring to FIG. 2, a perspective diagram of the apparatus 100 is illustrated. The apparatus 100 includes a support member 120 and a retaining member 140. The support member 120 receives the cooling module 230 along an alignment member 226. For example, the alignment member 226 includes a groove that extends across the length of the support member 120 to receive the cooling module 230. The support member 120 may further include an overflow member 210 to receive excess fluid from the apparatus 100, such as a drain or channel 212 that extends along the base of the support member 120 or a portion thereof. For example, the overflow member 210 may be formed to receive excess fluid from the support member 120 at a back end 220 of the apparatus 100, i.e., the support member 120 and/or base are positioned to direct the fluid towards an overflow aperture 214 at the back end 220.

The support member 120 includes a fluid supply line 222 to mate with a supply line connection 232 of the cooling module 230 and a fluid return line 224 to mate with a return line connection 234 of the cooling module 230. For example, the fluid supply line 222 and the fluid return line 224 are positioned to mate with the cooling module 230 at a back end 220 of the support member 120, i.e., near a backplane.

The retaining member 140 to secure the cooling module 230 in place. For example, the cooling module 230 includes a wet disconnect water wall that is held in place at the front of the support member 120 using the retaining member 140. The retaining member 140 holds the wet disconnect water wall 230 in place to maintain a connection between the wet disconnect wall and the electronic module. The apparatus 100 illustrates the retaining member 140 located adjacent to a cooling module connector 238 that connects the cooling module 230 to an electronic module. The cooling module connector 238 is positioned on a side opposite the supply line connection 232 and the return line connection 234. The supply line connection 232 and the return line connection 234 do not need to be opposite the cooling module connector 238; however, the cooling module connector 238 as illustrated is positioned near a front portion 231 to allow the connection between the cooling module 230 and the electronic module to be visible during insertion and provide the possibility of visual inspection during use, i.e., visual inspection for leaks. For example, the cooling module connector 238 connects to the electronic module at a front portion or front end of both the cooling module 230 and the electronic module.

As illustrated in FIG. 2, the wet disconnect water wall includes a cooling module connector 238, and a fluid manifold 236. The fluid manifold 236 to distribute a fluid within the wet disconnect water wall 230 and to and from the electronic module. The cooling module connector 238 includes a cooling module supply connector 237 and a cooling module return connector 239. The cooling module supply connector 237 to mate with the electronic module to form a fluid-tight connection and provide the fluid to an electronic module, such as a compute module that provides computer solutions, storage solutions, network solutions, and/or equipment optimized to deliver cloud services. The cooling module return connector 239 to mate with the electronic module to form a fluid-tight connection and receive the fluid from the electronic module. The cooling module supply connector 237 and the cooling module return connector 239 are positioned at a front portion 231 of the wet disconnect water wall.

FIG. 3 illustrates a schematic diagram of the apparatus 100 according to an example. The support member 120 includes a base 322 and a cooling support wall 324. The base 322 including the cooling module alignment member 226 to align the cooling module 230. For example, the cooling module alignment member 226 includes an alignment groove 326 formed in the base 322. The alignment groove 326 to engage and/or align with the cooling module 230 during alignment. The cooling module alignment member 226 may further include other guides or protrusions, such as another groove in a top or side portion of the support member 120 to align the cooling module 230 along the cooling support wall 324. For example, two grooves may be used, such as an alignment groove 326 formed in the base 322 to support and align the cooling module 230, and a mating groove 338 formed in a top wall 330 to mate with a top portion 233 of the cooling module.

The cooling support wall 324 extends from the base 322 to support and align the cooling module 230. The cooling support wall 324 is illustrated to extend the height of a server rack. The cooling support wall 324 may be positioned adjacent to other components and/or structures. For example, the cooling support wall 324 may be adjacent to a heat exchanger 350 that is formed in a center portion of the apparatus 100.

The support member 120 is illustrated to further include at least two side walls 328 that extend from the base 322 and support the structure formed therein. The use of side walls 328 is optional and the size and configuration of the side walls 328 when used may vary. The support member 120 may further include a top wall 330 that extends between the at least two side walls 328 and enclosures the apparatus 100. At least one of the at least two side walls 328 may also include the electronic module alignment member 338, such as guide members or guiderails to position and/or support the electronic module and/or components inserted into the support member 120.

As illustrated in FIG. 3, the overflow member 210 may be formed in the base 322. For example, a portion of the base 322 may be formed to receive the fluid or receive a tray that collects the fluid. Alternatively, the overflow member 210 may be connected to the base 322 or positioned below the base 322 to receive any fluid that leaks or drips within the apparatus 100. For example, the base 322 may include an overflow aperture 214 and be formed to direct fluid towards the aperture that has a tray or channel 212 thereunder to collect the fluid, such as to direct fluid to a back end 220 of the apparatus 100.

Figure 6:
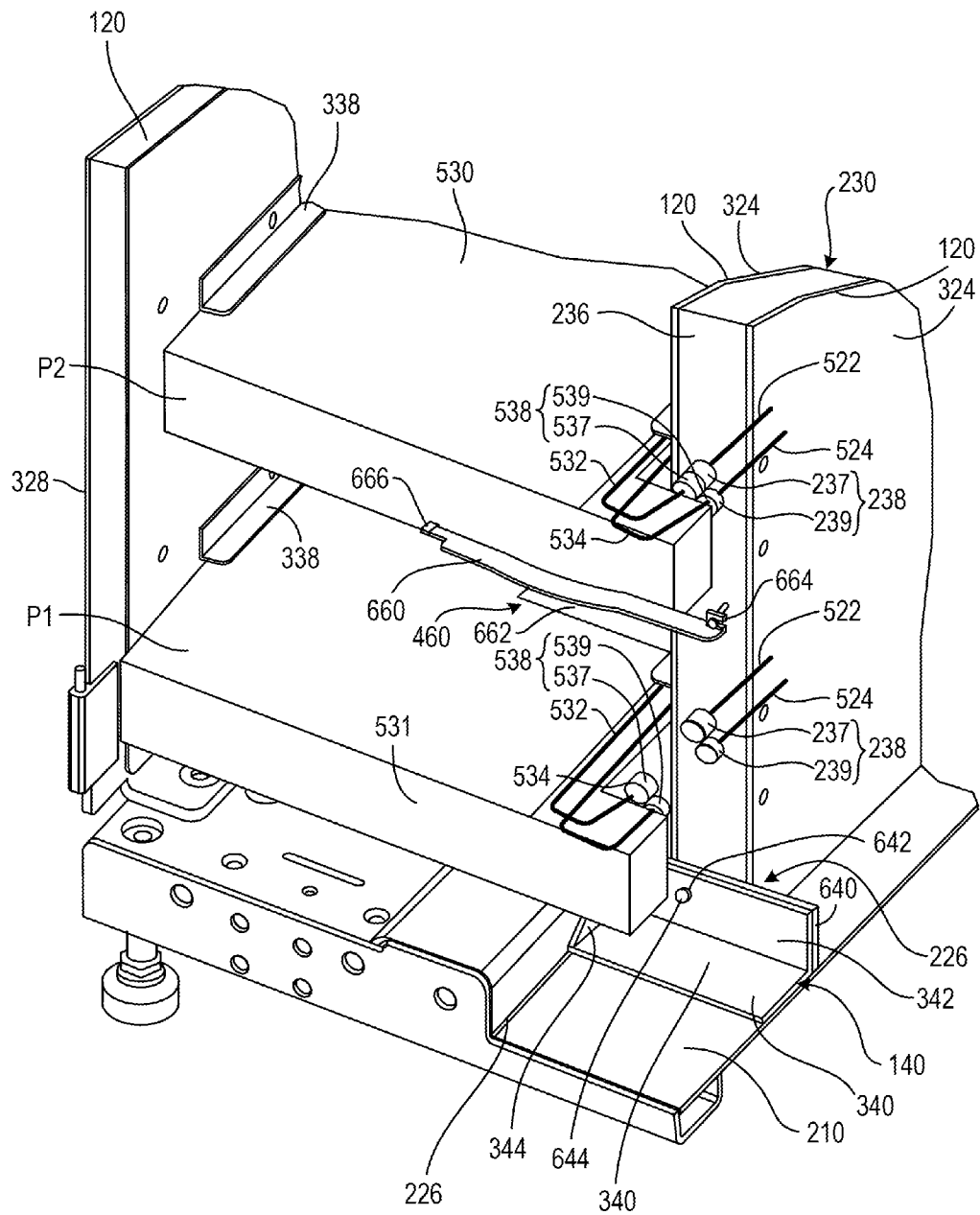
FIG. 6 illustrates a schematic diagram of a portion of the system of FIG. 4 according to an example.

The retaining member 140 is illustrated as fitting above the overflow member 210 in FIG. 3. For example, the retaining member 140 may be formed of steel and include a retaining body 340, a retaining wall 342, and a pair of retaining arms 344, 346. The retaining body 340 and the retaining wall 342 are formed of two planar sheets of, for example, steel, that meet at approximately a ninety degree angle. The pair of retaining arms 344, 346 extend from the retaining body 340 and the retaining wall 342 to engage the retaining body 340 and/or retaining wall 342 with the cooling module 230 and secure or hold the cooling module 230 in place. The retaining member 140 may further include support apertures, such as a pair of apertures formed in the retaining wall 342 that are formed to receive and/or engage with support pins extending from the cooling module, as illustrated in FIG. 6.

The cooling module 230 is illustrated in a position aligned for insertion into the support member 120 with the cooling module connectors 238 that mate with the electronic modules visible; however, no electronic modules are illustrated in the rack or support member 120 of FIG. 3. For example, the wet disconnect water wall includes a fluid manifold 236 to distribute a fluid to and from the electronic module and a cooling module connector 238 that connects to the electronic module to provide and remove heat therefrom using the fluid.

The apparatus 100 is designed to interchangeably receive a plurality of cooling modules 230. The design of the support member 120 and the retaining member 140 accommodate the plurality of cooling modules 230. The cooling module 230 may include, for example, a dry disconnect water wall, a wet disconnect water wall, and/or a mechanical support wall for use with air cooling. For example, when the cooling module 230 is a dry disconnect water wall, the cooling module 230 includes a fluid manifold 236 to direct a cooling fluid and a thermal mating member (not shown) on an opposite side to receive heat from the electronic modules. The thermal mating member may be positioned adjacent to a heat block that is along the edge of the electronic module that aligns with the cooling module 230.

Figure 4:
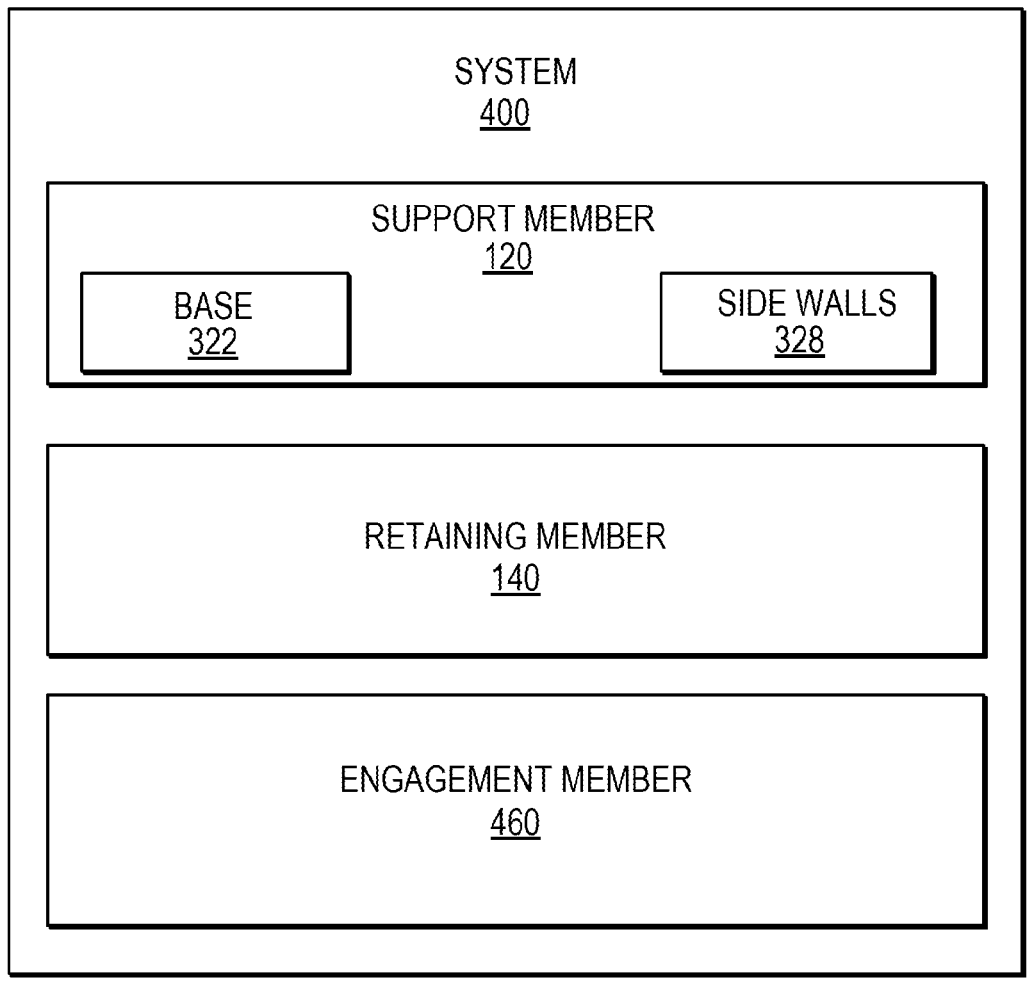
FIG. 4 illustrates a block diagram of a system to cool an electronic module according to an example.

FIG. 4 illustrates a block diagram of a system 400 to cool an electronic module according to an example. The system 400 includes a support member 120, a retaining member 140, and an engagement member 460. The support member 120 to receive a cooling module 230 and an electronic module. The cooling module 230 and the electronic module to mechanically engage with one another to remove heat from the electronic module 530 using the cooling module 230. For example, the mechanical engagement provides a fluid-tight connection between the cooling module 230 and the electronic module to enable transfer of a fluid therebetween.

The support member 120 includes a base 322 and a plurality of walls. The base 322 has a cooling module alignment member 226 to receive the cooling module 230 and align the cooling module 230 with a cooling module connector 238 at a front portion 231 of the cooling module 230. The plurality of walls extend from the base. The plurality of walls include a plurality of side walls 328 to receive the electronic module using, for example, an electronic module alignment member 338, such as the guiderails. The plurality of walls may further include a cooling support wall 324 to support and align the cooling module 230.

The retaining member 140 to secure or hold the cooling module 230 within the support member 120. For example, the retaining member 140 to prevent the cooling module 230 from shifting or moving after assembly. Movement of the cooling module 230 after the electronic module and the cooling module 230 are connected with a fluid-tight connection could compromise the fluid-tight connection and a leak may result.

The engagement member 460 to attach to the base 322 and engage with the electronic module. The engagement member 460 to secure the electronic module therein. For example, the engagement member 460 may include a lever that engages with the electronic module in a secured position to prevent movement. Similar to the retaining member 140, the engagement member 460 positions the electronic module 530 to maintain the fluid-tight connection between the electronic module and the cooling module 230. Maintaining the fluid-tight connection reduces the chance of a leak.

Figure 5:
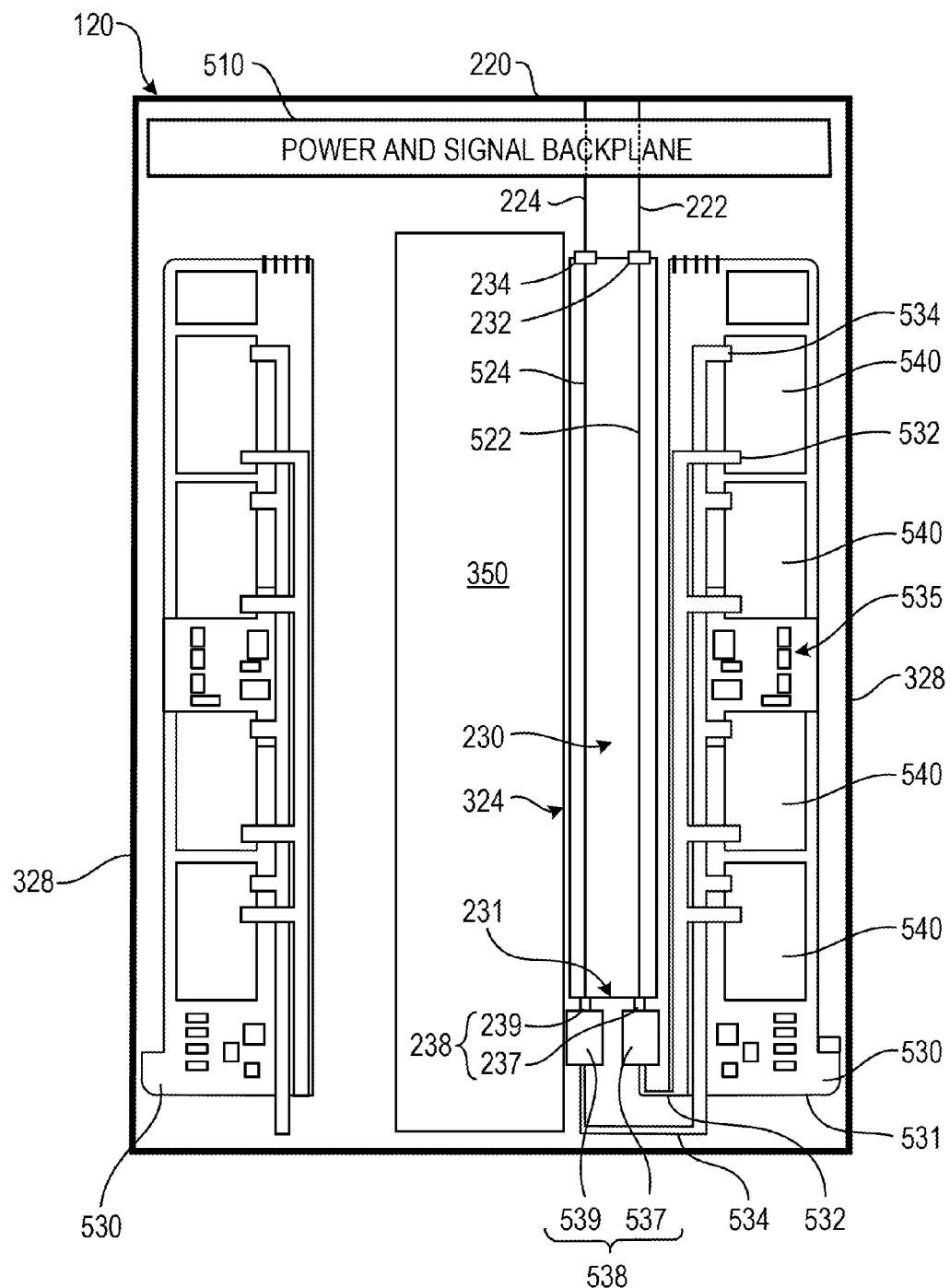
FIG. 5 illustrates a top view of the system of FIG. 4 according to an example.

FIG. 5 illustrates a top view of the system of FIG. 4 according to an example. The system 400 to cool an electronic module 530. FIG. 5 illustrates the support member 120, i.e., a rack with a plurality of electronic modules 530, i.e., servers. The rack forms the support member 120 and may support and align the electronic module 530 with the cooling module 230. For example, the support member 120 positions the cooling module 230 and the electronic module 530 adjacent to one another to facilitate engagement therebetween.

The support member 120 to receive the cooling module 230 is located adjacent to the electronic module 530. The support member 120 includes the fluid supply and return lines 222, 224 formed therebetween. The fluid supply line 222 to mate with a supply line connection 232 of the cooling module 230 and the fluid return line 224 to mate with a return line connection 234 of the cooling module 230. For example, the fluid supply line 222 and the fluid return line 224 are positioned to mate with the cooling module 230 at a back end 220 of the support member 120, i.e., near a backplane 510. The electronic module 530 receives the fluid from a front portion 231 of the cooling module 230, i.e., an end opposite the fluid supply and return lines 222, 224.

The support member 120 receives the cooling module 230 along an alignment member 226. For example, the alignment member 226 includes a groove along the support member 120 to receive the cooling module 230, as illustrated in FIGS. 2-3. The cooling module 230 is held in place or secured within the support member 120 using a retaining member 140, as illustrated above in FIGS. 2-3.

The cooling module 230 to remove heat from the electronic module 530. For example, the cooling module 230 includes a wet disconnect water wall to remove the heat using a fluid. The wet disconnect water wall includes a fluid manifold 236 and a cooling module connector 238. The fluid manifold 236 to distribute a fluid within the wet disconnect water wall to provide the fluid to and receive the fluid from the electronic module 530. The fluid manifold 236 illustrated includes a cooling supply tube 522 and a cooling return tube 524. The cooling supply tube 522 connects to the supply line connection 232 and the cooling module connector 238, i.e., the cooling module supply connector 237, to transfer the fluid therebetween. The cooling return tube 524 connects to the return line connection 232 and cooling module connector 238, i.e., the cooling module return connector 239, to transfer the fluid therebetween.

The cooling module connector 238 includes a cooling module supply connector 237 and a cooling module return connector 239. The cooling module supply connector 237 to mate with the electronic module to form a fluid-tight connection and provide the fluid to an electronic module 530. The cooling module return connector 239 to mate with the electronic module to form a fluid tight connection and receive the fluid from the electronic module 530. The cooling module supply connector 237 and the cooling module return connector 239 are positioned at a front portion 231 of the wet disconnect water wall.

The electronic module 530 is positioned adjacent to the cooling module 230. The electronic module 530 includes computer solutions, storage solutions, network solutions, and/or equipment optimized to deliver cloud services. The electronic module 530 may be supported by the support member 120, such as a server rack illustrated in FIG. 5. The electronic module 530 mates with the cooling module 230 using an electronic module connector 538. The electronic module connector 538 connects to the cooling module connector 238. The electronic module connector 538 includes an electronic supply connector 537 and an electronic module return connector 539. The electronic module supply connector 537 connects to the cooling module supply connector 237 to receive the fluid from the cooling module and distribute the fluid within the electronic module 530 via the electronic module supply tube 532. The electronic module return connector 539 connects to the cooling module return connector 239 to remove the fluid from the electronic module 530 and provide the fluid to the cooling module 230 via the electronic module return tube 534.

The cooling module supply connector 237 and the cooling module return connector 239 are positioned at a front portion 231 of the cooling module 230 i.e., an end opposite the fluid supply and return lines 222, 224. Positioning the cooling and electronic connectors 238, 538 at the front portion 231 of the cooling module 230 and the rack increases the visibility of the connectors and potential leaks. The connection at the front portion 231 may also allow visual confirmation of proper connection between the cooling module 230 and the electronic module 530 since the connection is at the front portion 231 of the cooling module 230 and the front of the electronic module 530.

The electronic module 530 includes an electronic module supply tube 532 and an electronic module return tube 534. The electronic module supply tube 532 connects to the electronic module supply connector 537 and a heat sink 540 in the electronic module 530 to supply fluid to the heat sink 540. The electronic return tube 534 connects to the electronic module return connector 539 and the heat sink 540 to receive fluid from the heat sink 540. The electronic module 530 may also include additional electronic components 535, such as a processor, memory, a hard drive, and/or a fan. For example, direct liquid cooling may be supplemented with other cooling methods, such as air cooling, which may be more cost effective than providing coolant plumbing lines to all heat sources.

The electronic module 530 may further include an engagement member 460 to position the electronic module 530. For example, the engagement member 460 positions the electronic module 530 by engaging with the electronic module 530 and aligning the electronic module 530 with the cooling module 230 to allow engagement therewith. An example of the engagement member 460 includes a lever that locks the electronic module 530 into place. For example, the lever 660 extends from the support member 120 via the portion 662 and engages with a fixed pin 664 on the coolant module 230 and an engagement pin 666 on the electronic module 530. The engagement member 460, such as a lever may also be used to ensure proper alignment of the electronic module 530.

A heat exchanger 350 may be positioned adjacent to the cooling module 230. The heat exchanger 350 removes heat from the air that is being recirculated within the enclosure by fans. This cooled air keeps the smaller electronic components on each electronic module 530 cool, since the smaller electronic components may not be connected to the liquid cooling system. The fluid with the heat from the electronic module 530 and the heat exchanger 350 may then be recycled by being pumped to an outdoor air cooled heat exchanger, such as a radiator, or cooled using a building chilled water loop.

In an alternate example, the heat exchanger 350 may recycle the fluid received from the fluid return line 224. The fluid from the fluid return line 224 may be a higher temperature due to receiving heat from the electronic module 530. The heat exchanger 350 may remove the heat and return the fluid to the fluid supply line 222 at a lower temperature to allow reuse of the fluid and continuous cooling of the electronic module 530.

The support member 120 also includes a power and signal backplane 510 in the back end 220 or rear. The power and signal backplane 510 supplies power and facilitates communication between the plurality of electronic modules 530.

FIG. 6 illustrates a schematic diagram of a portion of the system of FIG. 4 according to an example. The support member 120 includes a base 322 and a cooling support wall 324. The base 322 including the cooling module alignment member 226 to align the cooling module 230. For example, the cooling module alignment member 226 includes an alignment groove 326 formed in the base 322, as illustrated in FIG. 3. The alignment groove 326 to align and/or engage with the cooling module 230 during alignment. The cooling module alignment member 226 may further include other guides or protrusions, such as another groove in a top or side portion of the support member 120 to align the cooling module 230. For example, two grooves may be used, such as an alignment groove 326 formed in or extending from the base 322 to support and align the cooling module 230, and a mating groove 338 formed in a top wall 330 to mate with a top portion 233 of the cooling module 230.

The cooling support wall 324 extends from the base 322 to support and align the cooling module 230. The cooling support wall 324 may be positioned adjacent to other components and/or structures. For example, the cooling support wall 324 may be adjacent to a heat exchanger 350 that is formed in a center portion of the system 400, as illustrated in FIG. 5. The support member 120 is illustrated to further include at least two side walls 328 that extend from the base 322 and support the structure formed therein. The support member 120 illustrated includes two side walls 328, with one of the two side walls 328 supporting both the electronic module 530 and the cooling module 230. One or more of the at least two side walls may include an electronic module alignment member 338, such as guide members or guiderails to receive and hold the electronic module 530 and/or components inserted into the support member 120.

The support member 120 may further include an overflow member 210 to receive excess fluid. As illustrated in FIG. 6, the overflow member 210 may be formed in the base 322. For example, a portion of the base 322 may be formed to receive the fluid or receive a tray that collects the fluid. Alternatively, the overflow member 210 may be connected to the base 322 or positioned below the base 322 to receive any fluid that leaks or drips within the system 400. For example, the base 322 may include an overflow aperture 214 and be formed to direct fluid towards the overflow aperture 214, such as the back end 220. The support member 120 and/or base 322 may have a tray or channel 212 thereunder to collect the fluid, as illustrated in FIG. 2.

The support member 120 to receive the cooling module 230, i.e., the wet disconnect water wall. The cooling module 230 is illustrated with a front portion 231 of the cooling module 230 being visible, which illustrates the cooling module connectors 238 that contact the electronic modules 530. The wet disconnect water wall includes a fluid manifold 236 to control or distribute a fluid with the wet disconnect water wall and to and from the electronic module. A cooling module connector 238 connects to the electronic module 530 and provides the fluid to the electronic module 530 and removes heat from an electronic module 530 using the fluid.

For example, the cooling module 230 with the wet disconnect water wall includes the fluid manifold 236 with the cooling module connector 238 connected thereto. The fluid manifold 236 to receive the fluid from a supply, such as, a supply line 222 in the rack via the cooling supply tube 522. The fluid manifold 236 to distribute the fluid to the cooling module supply connector 237, which mates with the electronic module supply connector 537, which is also near a front end 531 of the electronic module 530. The fluid manifold 236 to return the fluid to the fluid return line 224, via the cooling return tube 524. The fluid manifold 236 to receive the fluid from the cooling module return connector 239, which mates with the electronic module return connector 539, which is also near the front end 531 of the electronic module 530. The cooling module supply connector 237 and the cooling module return connector 239 are positioned at a front portion 231 of the wet disconnect water wall.

The retaining member 140 to hold the cooling module 230 in place. For example, the cooling module 230 includes a wet disconnect water wall that is secured near the front portion 231 using the retaining member 140. The retaining member 140 secures the fluid manifold 236 of the wet disconnect water wall in place to maintain the fluid-tight connection with an electronic module 530. The system 400 illustrates the retaining member 140 located adjacent to a cooling module connector 238 that connects the cooling module 230 to an electronic module 530. The retaining member 140 is illustrated as fitting above the overflow member 210 in FIG. 6.

For example, the retaining member 140 may be formed of steel and include a retaining body 340, a retaining wall 342, and a pair of retaining arms 344, 346. The retaining body 340 and the retaining wall 342 formed of two planar sheets of, for example, steel, that meet at a ninety degree angle. The pair of retaining arms 344, 346 extend from the retaining body 340 and the retaining wall 342 to engage the retaining body 340 and/or retaining wall 342 with the cooling module 230 and secure or hold the cooling module 230 in place. The retaining member 140 may further include support apertures, such as a pair of holes 642 formed in the retaining wall 342 that are formed to receive and/or engage with support pins 644 extending from the cooling module 230. The retaining member 140 may further include or connect with a gasket 640 that lies between the retaining body 340 and retaining wall 342 and the cooling module 230.

The support member 120 to receive the electronic module 530 and position the electronic module 530 adjacent to the cooling module 230. The electronic module 530 includes computer solutions, storage solutions, network solutions, and/or equipment optimized to deliver cloud services. The electronic module 530 may be supported by the support member 120, such as a server rack illustrated in FIG. 6. The electronic module 530 is illustrated in two positions, a partially installed position P1 and a fully installed position P2. The partially installed position, P1 illustrates the cooling module connectors 238 and the electronic module connectors 538 prior to forming the fluid-tight connection with the engagement member not engaged with the electronic module 530. The fully installed position, P2 illustrates the cooling module connectors 238 and the electronic module connectors 538 connected and the engagement member engaging with the electronic module 530.

The electronic module 530 mates with the cooling module 230 using an electronic module connector 538. The electronic module connector 538, which is positioned towards the front end 531 of the electronic module 530, connects to the cooling module connector 238, which is positioned in the front portion 231 of the cooling module 230. The electronic module connector 538 includes an electronic module supply connector 537 and an electronic module return connector 539. The electronic module supply connector 537 connects to the cooling module supply connector 237 to receive the fluid from the cooling module 230 and distribute the fluid within the electronic module 530. The electronic module return connector 539 connects to the cooling module return connector 239 to remove the fluid from the electronic module 530 and provide the fluid to the cooling module 230.

For example, the electronic module 530 includes an electronic module supply tube 532 and an electronic module return tube 534. The electronic module supply tube 532 connects to the electronic module supply connector 537 and a heat sink 540 in the electronic module 530 to supply fluid to the heat sink 540, as illustrated in FIG. 5. The electronic module return tube 534 connects to the electronic module return connector 539 and the heat sink 540 to receive fluid from the heat sink 540, as illustrated in FIG. 5. The electronic module 530 may also include additional electronic components 535, such as a processor, memory, a hard drive, and/or a fan.

The cooling module connectors 238 and the electronic module connectors 538 illustrated in FIG. 6 are blind mate connectors to connect to the cooling module 230 and the electronic module 530. The blind mate connector provides a fluid-tight seal when engaged to prevent leaks. For example, the blind mate connectors mechanically engage the cooling module 230 with an electronic module 530. For example, the mechanical engagement provides a fluid-tight connection between the cooling module 230 and the electronic module 530 to enable transfer of a fluid therebetween.

The cooling module supply connector 237 and the cooling module return connector 239 are also positioned at a front portion 231 of the cooling module 230 i.e., an end opposite the fluid supply and return lines 222, 224. Positioning the cooling and electronic module connectors 238, 538 at the front portion 231 of the cooling module 230 and the rack increases the visibility of the connectors and potential leaks. For example, the connection at the front portion 231 may also allow visual confirmation of proper connection between the cooling module 230 and the electronic module 530, which reduces chances of leaks and provides greater visibility of leaks.

The support member 120 aligns the cooling module 230 and the electronic module 530 such that the cooling module 230 receives the fluid from a front portion 231 of the cooling module 230 using the cooling module connector 238 and the electronic module connector 538. The connection is visible during insertion and provides the possibility of visual inspection during use, i.e., visual inspection for leaks since the connection between the cooling module 230 and the electronic module is at the front portion 231.

The engagement member 460 to attach to the base 322 and engage with the electronic module 530. The engagement member 460 to secure the electronic module 530 therein. For example, the engagement member 460 may include a lever that engages with the electronic module 530 in a secured position to prevent movement. Similar to the retaining member 140, the engagement member 460 is used to maintain the fluid-tight connection between the electronic module and the cooling module 230 and prevent a leak.

The system 400 may connect the cooling module 230 and the electronic module 530 using any combination of attachment members and/or alignment members. For example, the combination of the retaining member 140, the engagement member 460, an electronic module alignment member 338, and/or the cooling module alignment members 226 are used to align and engage the cooling module 230 and the electronic module 530.

The system 400 is designed to interchangeably receive a plurality of cooling modules 230. The design of the support member 120 and the retaining member 140 accommodate the plurality of cooling modules 230. The cooling module 230 may include for example, a dry disconnect water wall, a wet disconnect water wall, and/or a mechanical support wall for use with air cooling. For example, when the cooling module 230 is a dry disconnect water wall, the cooling module 230 includes a fluid manifold 236 to direct a cooling fluid and a thermal mating member (not shown) on an opposite side to receive heat from the electronic modules 530. The thermal mating member may be positioned adjacent to a heat block that is along the edge of the electronic module that aligns with the cooling module 230.

Figure 7:
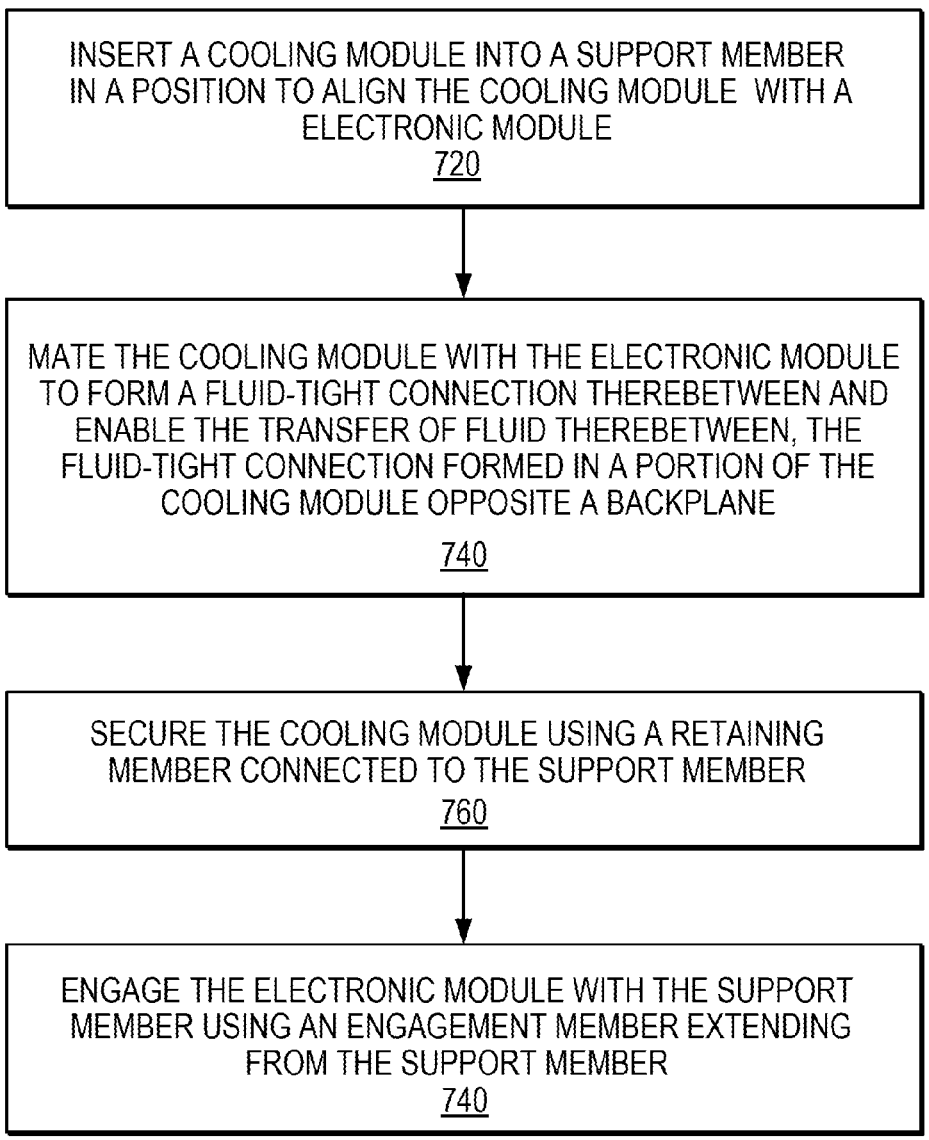
FIG. 7 illustrates a flow chart of a method to cool an electronic module according to an example.

FIG. 7 illustrates a flow chart 700 of a method to cool an electronic module according to an example. The method to insert a cooling module into a support member in a position to align the cooling module with an electronic module in block 720. For example, a cooling module alignment member may be used to align the cooling module. The cooling module removes heat from the electronic module.

In block 740, the cooling module to mate with the electronic module. The mating of the cooling module and the electronic module forms a fluid-tight connection therebetween that enables the transfer of fluid therebetween. The fluid is utilized to remove heat from the electronic module. The fluid-tight connection occurs in a portion of the cooling module opposite a backplane. For example, the cooling module receives fluid via a fluid supply line connection and a fluid return line connection near the backplane. The cooling module includes a cooling module supply connector and a cooling module return connector. The electronic module includes an electronic module supply connector and an electronic module return connector. The cooling module supply connector and the electronic module supply connector mate with one another to form a fluid-tight seal therebetween and enable fluid to transfer therethrough. Similarly, the cooling module return connector and the electronic module return connector mate with one another to form a fluid-tight seal therebetween and enable fluid to transfer therethrough.

The method to secure the cooling module using a retaining member connected to the support member in block 760. The alignment and/or securement of the cooling module may also be aided using an alignment member, such as a groove in the base of the support member, to position the cooling module. The method to engage the electronic module with the support member using an engagement member extending from the support member in block 780. The engagement of the electronic module may also be aided through use of an electronic module alignment member, such as a rail, guiderail, and/or alignment pins to receive, hold, and/or position the electronic module to connect with the electronic module supply connector with the cooling module supply connector and the electronic module return connector with the cooling module return connector.

Although the flow diagram of FIG. 7 illustrates specific orders of execution, the order of execution may differ from that which is illustrated. For example, the order of execution of the blocks may be scrambled relative to the order shown. Also, the blocks shown in succession may be executed concurrently or with partial concurrence. All such variations are within the scope of the present invention.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. An apparatus to cool an electronic module, the apparatus comprising:
    a support member to receive a cooling module, the support member includes a cooling module alignment member to align the cooling module with a cooling module connector at a front portion of the cooling module;
    the cooling module comprising a wet disconnect water wall, the wet disconnect water wall comprising:
        a fluid manifold to distribute a fluid to the electronic module; and
    a retaining member to secure the cooling module therein.

2. The apparatus of claim 1, wherein the support member further comprises a base and a cooling supply wall, the base including the cooling module alignment member to align the cooling module, the cooling support wall extending from the base to support the cooling module.

3. The apparatus of claim 2, wherein the cooling module alignment member comprises an alignment groove formed in the base, the alignment groove to engage with the cooling module.

4. The apparatus of claim 1, wherein the base further comprises an overflow member to receive excess fluid from the apparatus.

5. The apparatus of claim 1, further comprising a fluid supply line to mate with a supply line connection of the cooling module and a fluid return line to mate with a return line connection of the cooling module.

6. The apparatus of claim 1, wherein the wet disconnect water wall includes:
    a cooling module supply connector to mate with the electronic module to form a fluid-tight connection therebetween and provide the fluid to the electronic module; and
    a cooling module return connector to mate with the electronic module to form a fluid-tight connection therebetween and receive the fluid from the electronic module, the cooling module supply connector and the cooling module return connector positioned at a front portion of the wet disconnect water wall.

7. A system to cool an electronic module, comprising:
    a support member to receive a cooling module and the electronic module, the support member includes:
        a base including a cooling module alignment member to align the cooling module with a cooling module connector at a front portion of the cooling module, and
        a pair of side walls extending from the base, the pair of side walls including an electronic module alignment member to receive the electronic module, the support member aligns the cooling module and the electronic module such that the electronic module receives the fluid from a front portion of the cooling module;
    the cooling module comprising a wet disconnect water wall, the wet disconnect water wall comprising:
        a fluid manifold to control a fluid in the wet disconnect water wall;
    a retaining member to secure the cooling module within the support member; and
    an engagement member attached to the base to engage with the electronic module and position the electronic module therein.

8. The system of claim 7, further comprising a cooling support wall extending from the base to support and align the cooling module.

9. The system of claim 7, wherein the base further comprises an overflow member to receive excess fluid.

10. The system of claim 7, wherein the wet disconnect water wall includes:
    a cooling module supply connector to mate with the electronic module to form a fluid-tight connection therebetween and provide the fluid to the electronic module; and
    a cooling module return connector to mate with the electronic module to form a fluid-tight connection therebetween and receive the fluid from the electronic module.

11. The system of claim 7, wherein the support member further comprises a fluid supply line to mate with a supply line connection of the fluid manifold and a fluid return line to mate with a return line connection of the fluid manifold.

12. The system of claim 7, wherein the electronic module includes an electronic module supply connector to mate with the cooling module supply connector and an electronic module return connector to mate with the cooling module return connector.

13. The system of claim 7, wherein the cooling module alignment member comprises an alignment groove formed in the base and a mating groove formed in a top wall to mate with a top portion of the cooling module.

14. The system of claim 7, wherein the electronic module alignment member comprises a guiderail to receive and hold the electronic module.

15. A method to cool an electronic module, the method comprising:

inserting a cooling module into a support member in a position to align the cooling module with the electronic module, the cooling module comprising a wet disconnect water wall, the wet disconnect water wall comprising:
   a fluid manifold to distribute fluid to the electronic module;

mating the cooling module with the electronic module to form a fluid-tight connection therebetween and to enable the transfer of fluid therebetween, the fluid-tight connection formed in a portion of the cooling module opposite a backplane;

securing the cooling module using a retaining member connected to the support member; and engaging the electronic module with the support member using an engagement member extending from the support member.

16. The method of claim 15, wherein the wet disconnect water wall comprises:
   a cooling module supply connector to mate with the electronic module to form a fluid-tight connection therebetween and provide the fluid to the electronic module; and
   a cooling module return connector to mate with the electronic module to form a fluid-tight connection therebetween and receive the fluid from the electronic module, the cooling module supply connector and the cooling module return connector positioned at a front portion of the wet disconnect water wall.

* * * * *